(12) United States Patent
Kinoshita (10) Patent No.: US 6,307,989 B1
(45) Date of Patent: Oct. 23, 2001

(54) OPTICALLY FUNCTIONAL DEVICE (75) Inventor: Junichi Kinoshita, Kanagawa-Ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 09/431,442

(22) Filed: Nov. 1, 1999

(30) Foreign Application Priority Data

Oct. 30, 1998 (JP) ................................................. 10-309924

(51) Int. Cl.⁷ ................................................... G02B 6/34
(52) U.S. Cl. ................................. 385/37; 372/7; 372/102
(58) Field of Search ................................. 385/37; 372/7, 372/26, 45, 50, 102

(56) References Cited

U.S. PATENT DOCUMENTS

| | | | |
|---|---|---|---|
| 4,665,528 | * 5/1987 | Chinone et al. | 372/50 |
| 5,659,562 | * 8/1997 | Hisa | 372/96 |
| 5,701,325 | * 12/1997 | Ouchi et al. | 372/96 |
| 6,091,745 | * 7/2000 | Nitta | 372/50 |

FOREIGN PATENT DOCUMENTS 06-053619    2/1994    (JP).

* cited by examiner

Primary Examiner—Darren Schuberg
(74) Attorney, Agent, or Firm—Hogan & Hartson, L.L.P.

(57) ABSTRACT

In a guiding structure having a corrugation, depth of the corrugation is changed in the axial direction to change the effective refractive index by a considerable amount. The use of a 2nd-order or higher-order corrugation is desirable to ensure precise processing. It is also desirable that changes in depth is continuous. In a DFB laser using this structure, effective phase shifting and optical confinement factor can be controlled by changing the depth of the corrugation. In a DFB laser/modulator integrating device commonly using an active layer and an absorption layer, changes of the corrugation in the axial direction, including the presence or absence thereof, can considerably change optical confinement factor to the absorption layer and the active layer.

14 Claims, 4 Drawing Sheets

FIG. 6

OPTICALLY FUNCTIONAL DEVICE

BACKGROUND OF THE INVENTION

This invention relates to an optically functional device. More specifically, the invention relates to an optically functional device having an optical waveguide structure including a corrugation, such as distributed feedback (DFB) laser, in which a change in effective refractive index or a phase shift is made by changing the structure of the corrugation.

Grating-couplers, DFB lasers and DBR (distributed Bragg reflector) lasers are examples of optically functional devices having formed a corrugation along an optical waveguide. In these optically functional devices, the corrugation functions as diffraction gratings, and various functions such as wavelength selectivity, optical feedback, or optical coupling between different waveguides, for example, rely on the corrugation.

Among such corrugations, a corrugation using first-order Bragg diffraction has a period in the order of the wavelength of the guided light in a waveguide. Accordingly, the corrugation is extremely miniaturized, and it is not easy to fabricate it and control its cross-sectional configuration. Average period of the corrugation can be controlled very precisely by holographic interferometry. However, because of the excessively miniaturized pitch, it involved great difficulties in controlling the cross-sectional configuration.

Under the circumstances, it has been avoided to control the function of the waveguide itself by changing the configuration of the corrugation itself. Corrugation is generally regarded as a certain perturbation factor in a waveguide, and corrugation and waveguide are usually separated in function. That is, there was no example in which corrugation relates to a control of the basic function of the waveguide.

For example, in conventional integrated devices of a DFB laser or DFB laser and an electroabsorption modulator (EAM), for example, corrugation was merely provided as a waveguide perturbation. Then, for any change in waveguide parameter along he axial direction, e.g., a change in effective refractive index or optical confinement factor to a given layer, it was necessary to change the layer structure of the waveguide itself.

Figure 4:
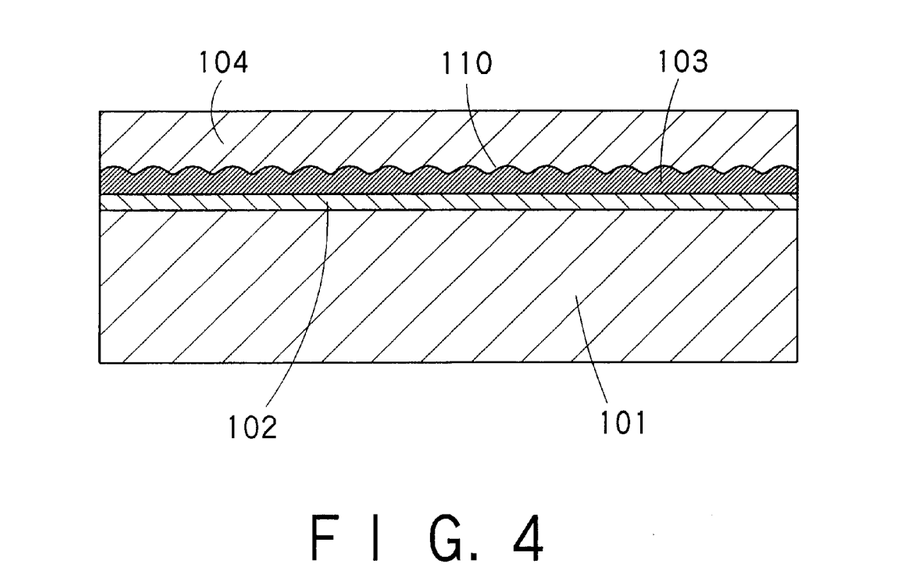
FIG. 4 is a cross-sectional view showing the basic waveguide structure of an conventional InGaAsP/InP DFB laser

FIG. 4 is a cross-sectional view illustrating a basic structure of the waveguide of a conventional InGaAsP/InP DFB laser, taken along a plane parallel to the guiding direction of the laser. Electrodes, facet structures for controlling reflection, etc. are omitted from illustration of FIG. 4. The structure shown in FIG. 4 is realized in the process explained below.

First grown on an n-type InP layer (or n-type InP substrate) 101 is an InGaAsP active layer 102 having an energy band gap corresponding to the oscillation wavelength. Although the active layer 102 has a MQW (multi-quantum well) structure alternately stacking InGaAsP thin layers different in composition in most cases, FIG. 4 illustrates it as a single layer for simplicity. Next grown thereon is an InGaAsP guiding layer 103 of a composition transparent to the oscillation wavelength.

Formed on the guiding layer 103 is a first-order corrugation 110. Period of the corrugation must be approximately 200 nm in the wavelength band of 1.3 μm and approximately 240 nm even in the wavelength band of 1.55 μm. To make the corrugation, patterning of a size corresponding to approximately a half of these periods is required. Therefore, an extremely minute processing technique is required, and it is not easy to make it.

In order to ensure an appropriate amount of distributed feedback, depth of the corrugation must be not deeper than 0.05 μm. However, it is not easy to control the depth in this range.

Usually, thickness of the guiding layer 103 is approximately 0.1 μm, and thickness of the active layer 102 is also approximately 0.1 μm. Therefore, in this range of depth of the corrugation, changes in effective refractive index of the entire waveguide are very small. In order to change the effective refractive index of the waveguide in the axial direction, it is necessary to modify the waveguide structure itself by changing the thickness of the active layer 102 and/or the guiding layer 103 themselves or changing their width (the aspect in the width direction is not illustrated), for example.

Next explained is an integrated device of a DFB laser and EAM.

Figure 5:
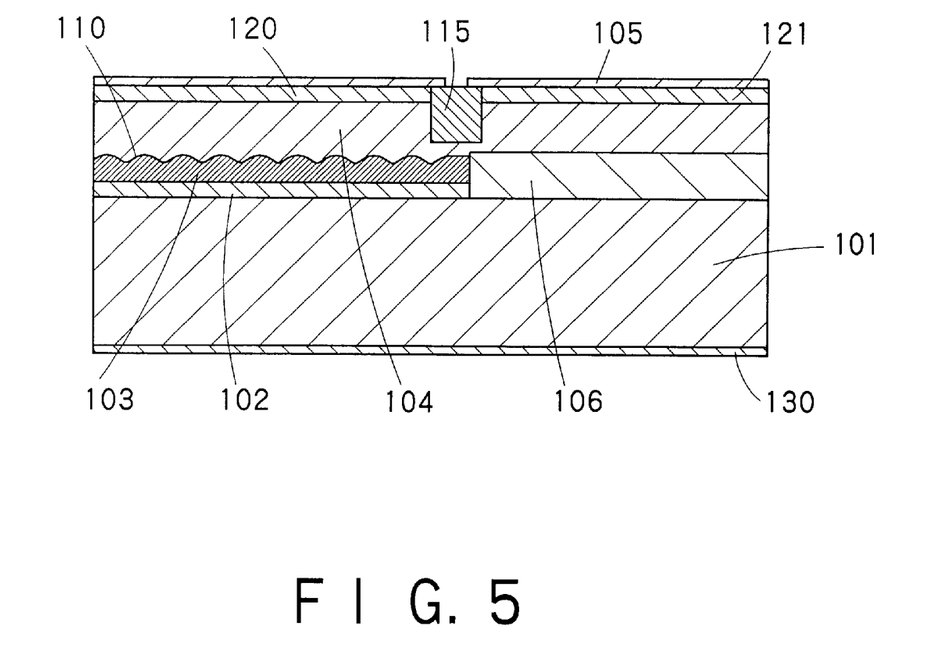
FIG. 5 is a longitudinal cross-sectional view showing the structure of an integrated device experimentally prepared by the Inventor in the course toward the invention.

FIG. 5 is a longitudinal cross-sectional view of an integrated device experimentally prepared by the Inventor in the course toward the present invention. Its structure is explained below in sequence of its manufacturing process. First grown sequentially on an n-type InP layer 101 are an active layer 102 and a guiding layer 103 to form the major part of the DFB laser. After that, a first-order corrugation 110 is formed. Then, a portion for the EAM is etched to remove the active layer 102 and the guiding layer 103, and a light absorption layer 106 is grown on the removed portion. The light absorption layer 106 is also a waveguide and in most cases configured as a MQW structure having a band gap slightly larger than that of the active layer 102. When an electric field is applied to this layer, the absorption edge shifts to the longer wavelength side due to QCFK effect (quantum confined Franz-Keldish effect) and/or QCSE effect (quantum confined Stark effect), and the layer becomes absorptive for the output spectral line from the DFB laser portion. The wavelength of the spectral line is determined by the refractive index of the waveguide structure and the period of the corrugation 110. By using this phenomenon and applying a high-speed signal to the EAM portion, output light from the DFB laser under DC operation can be modulated.

For the purpose of electrically insulating the DFB laser portion and the EAM portion from each other, there is provided a region 115 semi-insulated by bombarding protons. FIG. 5 also shows an n-side electrode 130 and p-side electrodes 120 (DFB laser side) and 121 (EAM side).

The structure of FIG. 5 requires, for realization thereof, a process for removing the active layer 102 and the guiding layer 103, once grown, and for newly growing the absorption layer 106. Additionally, this structure involves the problem that, although the optical output from the DFB laser should be smoothly guided to the absorption layer 6, the light becomes discontinuous at the boundary, and part of the light is reflected or scatters.

In the integrated device shown in FIG. 5, these defects might be removed by commonly using a same layer as the active layer 103 and the absorption layer 106.

Figure 6:
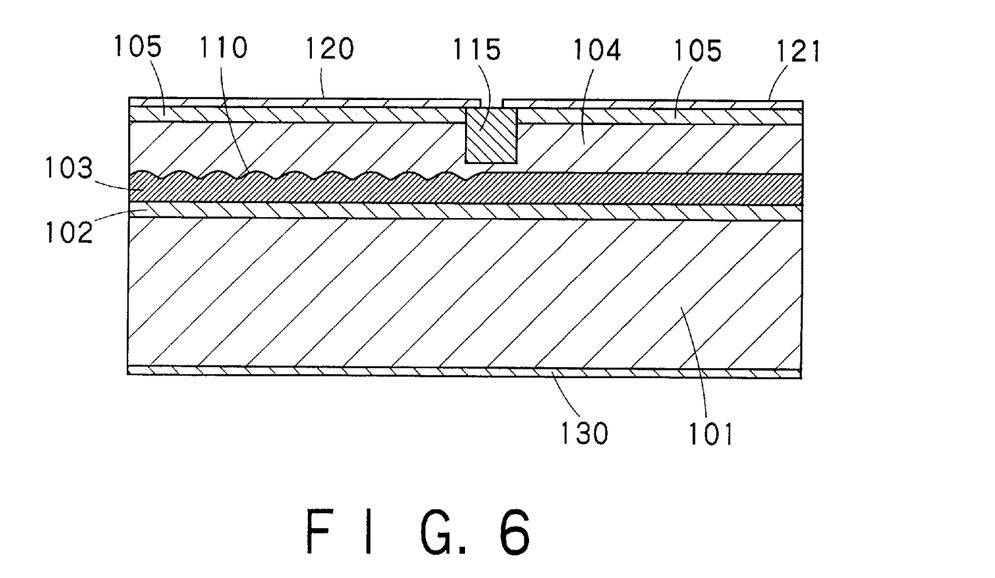
FIG. 6 is a cross-sectional view showing an integrated device commonly using an active layer and an absorption layer.

Fig. 6 is a cross-sectional view showing an improved integrated device.

In the example shown here, the absorption layer 102 and the guiding layer 103 in the DFB laser portion, and the absorption layer in the EAM portion are made of a common layer. Thus, the process of removing layers and the process of growing the absorption layer can be omitted. With the structure of FIG. 6, however, practical performance cannot be obtained actually. This is because the EAM portion also has an active layer, light absorption occurs in this active layer also when no field is applied, and extinction ratio is undesirably reduced. For improving the extinction ratio, it is necessary to reduce confinement of light in the active layer and to increase confinement of light to the guiding layer by increasing the thickness of the guiding layer 103.

However, the approach relying on increasing the thickness of the guiding layer invited problems in the DFB laser portion. That is, undesirable decrease in net gain occurs due to an increase in guiding loss caused by light absorption of the guiding layer 103 and insufficient light confinement to the active layer. There also occurs the problem that it is difficult for the laser portion to oscillate because the pn junction comes remoter from the active layer. Thus, if a layer structure is commonly used in an integrated device, the structure of one of its elements disturbs optimization of the structure of the other element.

SUMMARY OF THE INVENTION

It is therefore an object of the invention to provide a novel structure capable of realizing an effective refractive index and a phase shift structure in an optically functional device such as DFB laser and capable of optimizing the structure of each integrated element in an integrated optically functional device.

According to the invention, there is provided an optically functional device comprising an optical guiding structure for guiding light in a guiding direction, said optical guiding structure having a corrugation, said corrugation including a first portion having a first structure and a second portion having a second structure different from said first structure along said guiding direction, a difference between said first structure and said second structure being substantially larger than a perturbation given to effective refractive index of said optical guiding structure.

According to the invention, there is also provided an optically functional device having an optical guiding structure for guiding light in a guiding direction, comprising: the optical guiding structure having a corrugation; the corrugation includes a deep-configured portion and a shallow-configured portion along the guiding direction; and difference between effective refractive index of the optical guiding structure in the deep-configured portion and effective refractive index of the optical guiding structure in the shallow-configured portion being not smaller than $10^{-3}$.

The corrugation may include a portion continuously changing in depth between the deep-configured portion and the shallow-configured portion. In this case, because changes in waveguide parameter are continuous, the mode profile is converted slowly, and undesirable scattering or reflection can be prevented.

Additionally, the guiding structure may have a guiding layer and the corrugation formed on the guiding layer, the guiding layer being divided in form of islands in the deep-configured portion.

As a more specific example, the optically functional device according to the invention may further comprises: an active layer provided substantially in parallel with the guiding structure, and the optically functional device being configured as a DFB laser or a DBR laser in which light from the active layer is guided by the guiding structure and released externally. In case of a DFB laser, by mere changes in depth of the corrugation, effective refractive index can be changed to make an equivalent phase shift region. Additionally, optical confinement factor in the portion can be changed.

In another specific example, the optical functional device may further include: an active layer provided substantially in parallel with the guiding structure, and the deep-configured portion of the corrugation form a laser portion operative as a DFB laser or a DBR laser in which light from the active layer is guided by the guiding structure and released; the shallow-configured portion of the corrugation forming a modulator portion which functions as an electroabsorption modulator for modulating laser light from the deep-configured portion; and optical confinement factor for confining light to the active layer in the modulator portion being not larger than one half of optical confinement factor for confining light to the active layer in the laser portion. Also in case of an integrated device of a DFB laser and EAM, by merely changing the depth of the corrugation, it is possible to effectively decrease the influence from the light absorption layer in the DFB laser portion and to decrease the optical confinement factor to the active layer in the EAM portion.

According to the invention, there is further provided an optically functional device monolithically integrating a laser portion operative as a DFB or DBR laser and a modulator portion operative as an electroabsorption modulator, comprising:

a common active layer formed in the laser portion and the modulator portion; and a common guiding layer operative as a waveguide in the laser portion and as an light absorption layer in the modulator portion, the guiding layer having formed a corrugation in the laser portion, optical confinement factor for confining light to the active layer in the modulator portion being not larger than one half of optical confinement factor for confining light to the active layer in the laser portion. The corrugation preferably changes in depth continuously near the boundary between the laser portion and the modulator portion. In this case, because changes in waveguide parameter are continuous, the mode profile is converted slowly, and undesirable scattering or reflection can be suppressed.

In any of the above-summarized optically functional devices, the corrugation preferably has a period corresponding to the second or higher order of Bragg diffraction. Thus, it is possible to control the depth of the corrugation precisely and easily.

The invention is used in the modes explained above, and ensures the following effects.

That is, the invention can change the effective refractive index and forming a phase shift by merely changing the depth of the corrugation, and can thereby realize an inexpensive, high-performance optically functional device.

Additionally, according to the invention, by employing a second- or higher-order corrugation, the corrugation can be controlled in depth easily and precisely, and a sufficient change in refractive index can be made.

Further, according to the invention, by ensuring a continuous change in waveguide parameter, it is possible to convert the mode profile slowly and thereby prevent undesirable scattering or reflection.

As a result, according to the invention, when it is applied to a DFB laser or a DBR laser, since making the phase shift region and controlling the optical confinement factor are realized by changing the configuration of the corrugation, the laser can be manufactured easily, and spatial holeburning is prevented as well.

Furthermore, in the case where the invention is applied to an integrated device of a DFB laser and EAM having a simple structure commonly using the optical absorption layer and the active layer, the optical confinement factor to the active layer in the EAM portion can be reduced to a half of that in the DFB laser easily and reliably, and the EAM portion and the DFB laser portion can therefore be optimized using a simple structure and a simple manufacturing process. Therefore, a high-performance device can be provided inexpensively.

That is, a DFB laser employing the invention is economical, and excellent in single longitudinal mode characteristics and low threshold value oscillation characteristics. Therefore, an optical communication device using same is also inexpensive and excellent in characteristics. That is, the invention contributes to establish a large-capacity optical communication system economically, and the invention has great industrial advantages in largely enriching the infrastructure of an information communication system.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DETAILED DESCRIPTION OF THE PREFERRED EMBODIMENTS

According to the invention, a waveguide structure having a corrugation is made so that a change in the structure of the corrugation in the axial direction produces a change in effective refractive index. For this purpose, it is desirable to use a 2nd-order or higher-order corrugation which facilitates precise processing. It is also desirable to make the changes in the structure of the corrugation continuous.

In a DFB laser according to the invention, effective phase shift and/or optical confinement factor can be controlled by changing the structure, such as depth or cross-sectional shape, of the corrugation. In a DFB laser/modulator integrated device using an active layer and an absorption layer commonly, changes in the axial direction including the presence or absence of the corrugation can considerably change the optical confinement factor to the absorption layer and the active layer.

Explained below are embodiments of the invention with reference to the drawings.

Figure 1:
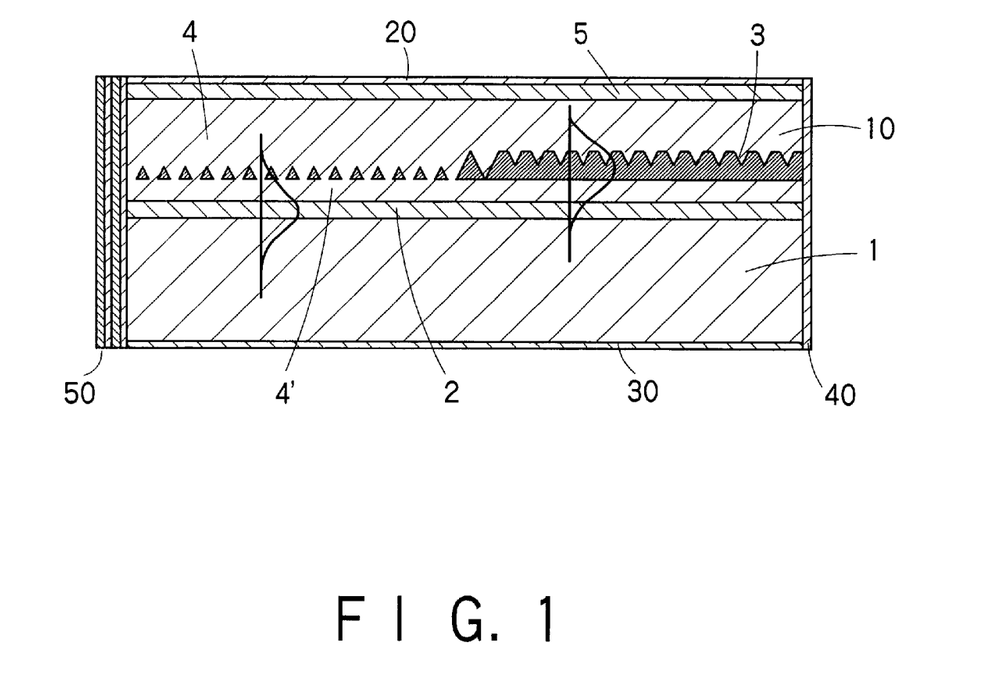
FIG. 1 a cross-sectional diagram schematically showing an optically functional device according to the first embodiment of the invention.

FIG. 1 is a cross-sectional view schematically showing an optically functional device according to the first embodiment of the invention. Here is shown a cross-sectional structure of a DFB laser taken along the guiding direction.

In the laser shown here, formed on an n-type InP layer (or n-type InP substrate) is an InGaAsP active layer having an energy band gap corresponding to the oscillation wavelength. The active layer 2 preferably has a MQW (multi-quantum well) structure alternately stacking InGaAsP thin layers different in composition. Formed on the MQW active layer 2 is a p-type InP first cladding layer 4', 0.1 $\mu$m thick. Further formed thereon is a 0.2 $\mu$m thick guiding layer 3. The guiding layer 3 is made of InGaAsP of a composition transparent to the oscillation wavelength, for example. The p-type InP cladding layer 4' is a buffer region for making an island-shaped corrugation. Formed on the guiding layer 3 is a corrugation 10. Period of the corrugation 10 preferably corresponds to 2nd or higher order of Bragg diffraction.

In the present invention, structure of the corrugation 10, namely, configuration or depth thereof, is changed to substantially change the effective refractive index of the waveguide along the laser guiding direction. That is, the corrugation has a change larger than a change regarded as perturbation of the refractive index in the guiding direction of the laser. The term "perturbation" herein means a change in configuration and/or depth of the corrugation as small as not affecting the refractive index of the entire waveguide.

Figure 2A:
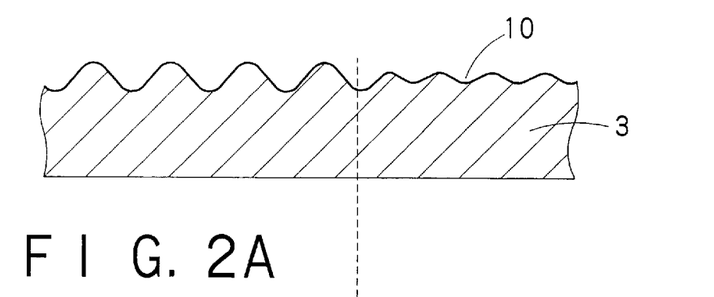
FIGS. 2A through 2D are schematic diagrams for explaining the mechanism of the invention.
Figure 2B:
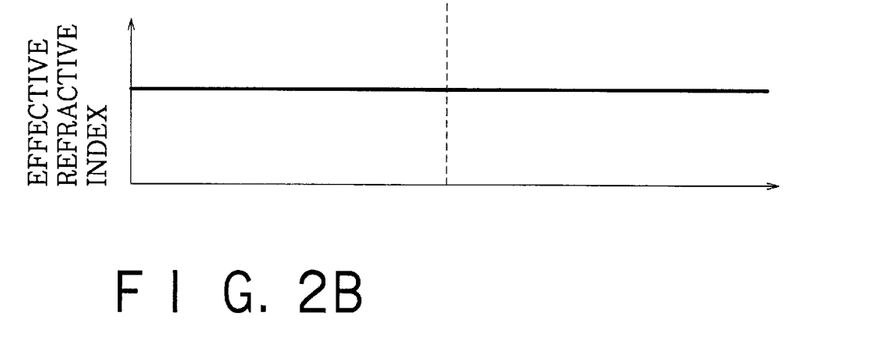

FIGS. 2A through 2D are schematic diagrams for explaining the mechanism of the present invention. FIG. 2A is a longitudinal cross-sectional view illustrating a waveguide including a corrugation configured to include a relatively small change in depth. FIG. 2B is a schematic diagram showing a profile of effective refractive index of the waveguide shown in FIG. 2A.

Figure 2C:
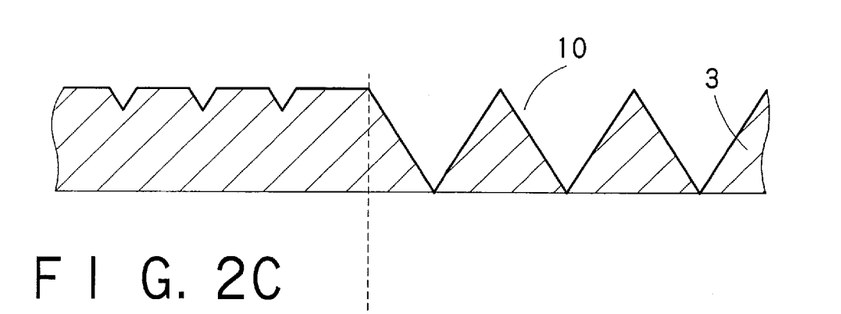
Figure 2D:
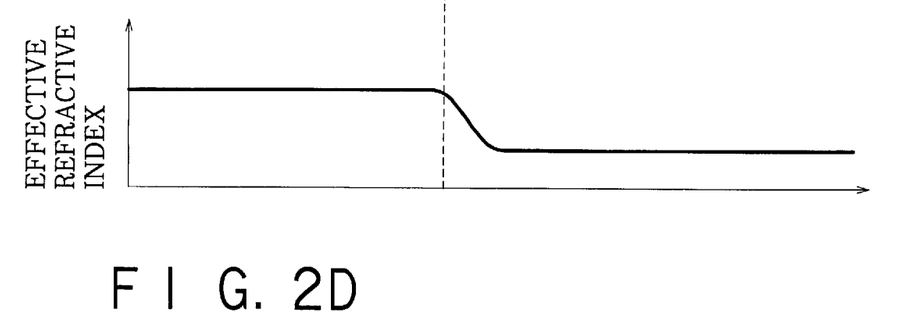

In contrast, FIG. 2C is a longitudinal cross-sectional view showing a waveguide so configured that its corrugation changes largely in depth or configuration along the guiding direction of the laser according to the invention. FIG. 2D is a schematic diagram showing the profile of effective refractive index of the waveguide shown in FIG. 2C.

When the change of the corrugation in configuration or depth is small as shown in FIG. 2A, this change seldom affects the effective refractive index of the waveguide. That is, in this case, the change in depth of the corrugation along the guiding direction is within the range of perturbation, and the average value of refractive index does not change in the guiding direction. In case of a typical 1st-order corrugation, the corrugation is shallow, and such change in depth is usually a perturbation.

In contrast, in the case where the change in configuration or depth of the corrugation is large as shown in FIG. 2C, this change is beyond a "perturbation". Then, in response to the change in configuration or depth of the corrugation, the average value of the effective refractive index of the waveguide changes. The present invention employs this mechanism.

Returning back to FIG. 1, in the laser shown here, structure of the corrugation 10, namely, configuration or depth thereof, largely changes along the guiding direction of the laser. That is, in the right half of the laser on the sheet of FIG. 1, a relatively shallow corrugation is formed on the guiding layer 3. In contrast, in the left half of the laser on the drawing sheet, a deep corrugation is formed in the guiding layer 3. As a result, the waveguide layer 3 is divided in form of an island. In a central portion of the laser, the depth of the corrugation gradually changes so that the difference of the depths in opposite sides be continuously smoothed. Period of the corrugation is maintained constant over the entire guiding length of the laser.

When the corrugation is changed in structure so large in the left and right side of the waveguide, this change is beyond a perturbation, and causes a change in effective refractive index.

Sequentially formed on the corrugation are a p-type InP layer 4 and a p$^+$-type InGaAsP contact layer. The p-type InP layer 4 is divided is partly continuous to the cladding layer 4' in the left side of the laser, and the guiding layer remains in form of islands. In this area, since the guiding layer 3 is divided, its influence is small. That is, in the left-side area, optical confinement to the active layer 2 is large, and the effective refractive index becomes small due to the predominance of the p-type InP.

In contrast, in the right-side region of the laser, influence of the guiding layer 3 is dominant, effective refractive index is therefore high, and optical confinement to the guiding layer 3 is larger than that to the active layer 2. FIG. 1 also shows a profile of the guiding mode indicating the optical confinement status.

In the central portion of the laser, i.e., the transition area where the configuration of the corrugation gradually changes, undesirable scattering or reflection caused by a discontinuous change is prevented, and the mode configuration is converted moderately. That is, conversion between the confinement status in the active layer and the confinement status in the guiding layer can be realized with a low loss.

According to the invention, by changing the corrugation in configuration of depth, a profile can be made in the effective refractive index, and optical confinement factor can be adjusted by a change in cross-sectional configuration of the corrugation.

Additionally, according to the invention, since the effective refractive index changed between the right side and the left side of the laser, the relative phase with respect to the corrugation equivalently changes as well. Therefore, a phase shift effect is obtained by merely changing the depth of the corrugation. As a result, it is possible to oscillate in a single longitudinal mode at the Bragg wavelength, obtain a larger threshold gain difference from the other mode, and to obtain the single longitudinal mode oscillation. Additionally, the structure effectively realizing a phase shift effect by gradually changing the effective refractive index can alleviate concentration of guided light to the phase shifting portion and prevent deterioration of the single longitudinal mode performance by "spatial holeburning". The term "spatial holeburning" herein pertains to a phenomenon that an increase in optical intensity leads to a decrease of carrier density, then an increase of the refractive index, further an effective change in phase shifting amount and finally a change of the longitudinal mode.

As a result of researches by the Inventor, it has been found that, for effectively producing a change in phase shift and confinement factor in the laser according to the invention, it is necessary to change the effective refractive index of the optical waveguide in the portion with the shallow corrugation by not less than $10^{-3}$ relative to the effective refractive index of the optical waveguide in the portion with the deep corrugation.

This is because a change in effective refractive index by a plasma effect occurs under a magnitude around $10^{-3}$. The term "plasma effect" herein pertains the phenomenon that, when free carriers are vibrated in the frequency of light, vibration of carriers comes out of phase to cancel out polarization of crystal lattice atoms and results in polarization. Once this effect occurs, the higher the carrier density, the smaller the refractive index. Then, the change amounts approximately $10^{-3}$ in maximum.

Therefore, it is necessary that a change in effective refractive index obtained by changing the corrugation in configuration or depth according to the invention exceeds this change by the plasma effect. Thus, it is desirable to change the configuration or the depth of the corrugation so that the change in effective refractive index of the optical waveguide be not smaller than $10^{-3}$.

Further, holeburning in the axial direction of the DFB laser is caused by a decrease in refractive index by the plasma effect. Therefore, also for preventing holeburning, it is desirable to change the configuration or depth of the corrugation so that the change in effective refractive index of the optical waveguide be not smaller than $10^{-3}$.

Additionally, according to the invention, by employing a corrugation corresponding to a 2nd-order or higher-order Bragg diffraction, its fabrication process becomes much easier and its cross-sectional configuration can be controlled precisely. That is, quantity of distributed feedback by a corrugation, in general, is expressed by a κL value which is the product of the coupling coefficient κ and the cavity length L. Optimum range of the κL value is usually 1<κL<1.5 approximately. In order to obtain the optimum κL value in a 2nd-order corrugation, a much deeper configuration than that for a 1st-order corrugation is required. Additionally, in case of a 2nd-order corrugation, its period for 1.3 $\mu$m lasing wavelength is approximately 0.4 $\mu$m, which is twice the period of a 1st-order corrugation.

Therefore, size of the corrugation may be considerably larger than that of a 1st-order corrugation. That is, it is possible to precisely control the cross-sectional configuration by using a method such as EB (electron beam) exposure, for example. However, if the guided wavelength within the waveguide is sufficiently large, easy and precise processing is possible even with a 1st-order corrugation.

On the other hand, if an anti reflection (AR) film 40 is coated on the right facet of the laser in FIG. 1 and a high-reflectance (HR) film 50 is coated on the left facet, optical output from the right AR facet is increased. In case of conventional lasers, an increase in optical intensity invites a decrease in carrier density and an increase in refractive index of the active layer 2, and this results in causing "spatial holeburning" in which the optical intensity effectively changes the phase shifting amount and changes the longitudinal mode. This might be alleviated but cannot be prevented completely even by using an effective phase shifting structure which gradually changes as far as light is confined in the active layer 2.

In contrast, in the laser according to the invention, since confinement to the active layer 2 in the right side with a larger optical intensity is small, the active layer 2 is not exposed to a high optical intensity. Therefore, the invention has the effect of significantly decreasing "spatial holeburning". This effect contributes to a significant improvement of the production yield of DFB lasers.

Next explained is a procedure for fabricating the corrugation in the present invention. Taking a case of making it by EB (electron beam) exposure, for example, after making the guiding layer 3 with a uniform thickness on the cladding layer 4', a resist, not shown, is stacked on the guiding layer 3. Then, by EB exposure, the resist is exposed so that the width of each maintained portion be 0.3 $\mu$m whereas the width of each removed portion be 0.1 $\mu$m on the right side in FIG. 1. Under the condition, EB exposure is progressed from the right side toward the left side in FIG. 1. Then, the condition is adjusted from a predetermined position of the cavity, namely, from a central portion in FIG. 1, to gradually increase the width of each removed portion until the width of the removed portion of the resist be 0.3 µm. Since the period is maintained constant, the width of each remaining portion of the resist decreases. In this manner, after the resist is patterned by EB exposure, the guiding layer 3 is etched using the resist as a mask. As a result, cross-sectional configuration of the corrugation made up of the guiding layer 3 appears as shown in FIG. 1. That is, it results in making the configuration maintaining a considerable amount of the guiding layer 3 in the right side and maintaining the guiding layer 3 merely in form of discrete islands in the left side.

In the present invention, by forming the corrugation to have 2nd-order or high-order period, it is possible to precisely control the cross-sectional configuration of the corrugation by precise patterning using EB exposure, for example.

Next explained is the second embodiment of the invention.

Figure 3:
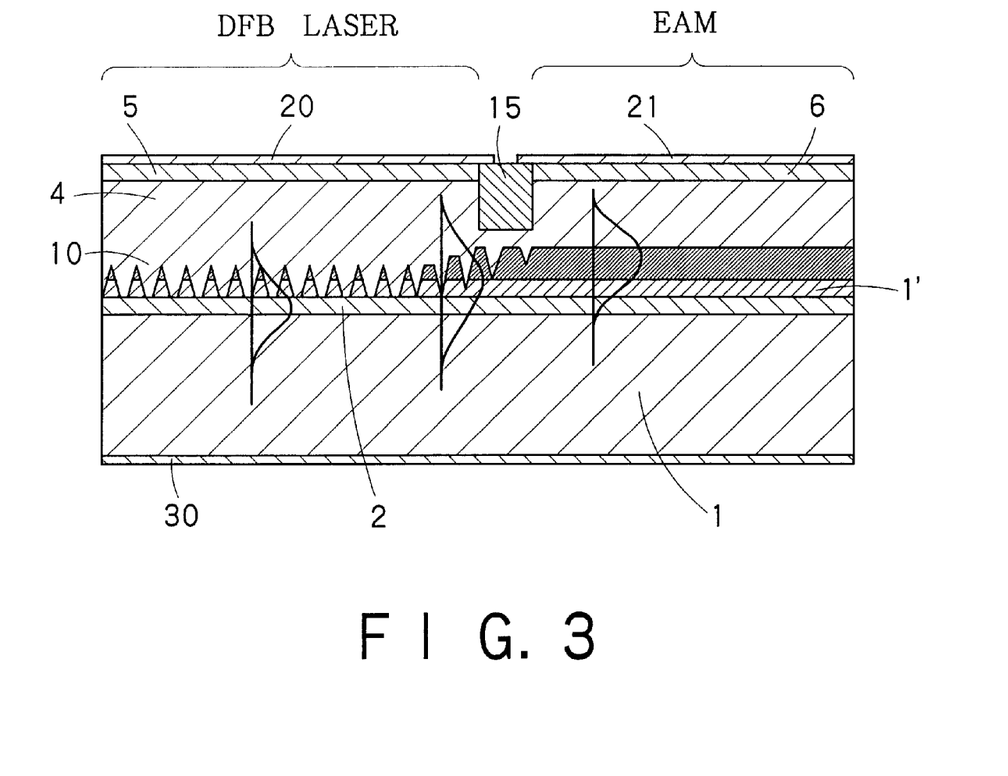
FIG. 3 is a cross-sectional view schematically showing an optical integrated device according to the second embodiment of the invention.

FIG. 3 is a cross-sectional view schematically showing an optical integrated device according to the second embodiment of the invention. That is, the optical integrated device shown here is an optically functional device integrating a DFB laser portion and an EAM portion.

In the optical integrated device of FIG. 3, sequentially formed on the n-type InP layer 1 are a MQW active layer 2, n-type InP second cladding layer 1' and guiding layer 6. The guiding layer 6 functions as a guiding layer in the DFB laser portion and functions as a light absorption layer in the EAM portion. Formed on the guiding layer 6 is a corrugation 10. The corrugation 10 is made deeper in the laser portion and shallower in the EAM portion. That is, structural change of the corrugation 10 along the axial direction exceeds perturbation of the refractive index. In the example shown here, almost no corrugation 10 is formed in the EAM portion. However, it is also acceptable to make the corrugation with a certain depth in the EAM portion. Also in this embodiment, period of the corrugation 10 is 2nd-order or a high-order period.

Thickness of the second cladding layer 1' is approximately 0.1 µm, for example, and the guiding layer 6 is grown to a thickness not less than 0.6 µm. Thereafter, the corrugation 10 is made.

Also in the embodiment shown here, the guiding layer 6 preferably has a MQW structure having a band gap slightly larger than that of the active layer 2. When an electric field is applied to this layer, the absorption edge shifts to the longer wavelength side due to QCFK effect (quantum confined Franz-Keldish effect) and/or QCSE effect (quantum confined Stark effect), and the layer becomes absorptive for the output spectral line from the DFB laser portion. The wavelength of the spectral line is determined by the refractive index of the waveguide and the period of the corrugation 10. By using this phenomenon and applying a high-speed signal to the EAM portion, output light from the DFB laser under DC operation can be modulated.

The second cladding layer 1' functions as a buffer region for making an island-shaped corrugation. Formed on the guiding layer 6 are an n-type InP first cladding layer 4 and a p+-type InGaAsP contact layer 5. Formed between the DFB laser and EAM is a region 15 semi-insulated by bombarding protons for the purpose of ensuring electrical insulation. Further provided are an n-side electrode 30 and p-side electrodes 20 (DFB laser side) and 21 (EAM side).

Also in this embodiment, by making the corrugation to have 2nd-order or high-order period, the pattern may be much larger than a 1st-order corrugation. Therefore, cross-sectional configuration of the corrugation can be controlled precisely and easily by using EB exposure, for example. A manufacturing method thereof is explained below.

First stacked on the guiding layer 6 is a resist, not shown. In the EAM region in the right side in FIG. 3, the resist is maintained without exposure. in the boundary area between the EAM portion and DFB portion, exposure is conducted to gradually increase the ratio of each removed portion of the resist toward the laser portion. This portion is a transition area. Exposure is progressed so that the width of each removed portion of the resist finally becomes not less than 0.3 µm in the DFB portion. As a result, as shown in FIG. 3, the guiding layer 6 remains uniformly in the EAM portion, whereas it remains in form of discrete islands in the DFB laser portion.

As a result of forming the corrugation 10 which varies in depth, the corrugation is deep enough for the p-type InP layer 4 to reach nearly contacting the active layer 2 in the DFB laser portion, and a pn junction is formed near the boundary with the active layer. And, the guiding layer 6 remains in form of discrete islands. As a result, influence of the guiding layer diminishes. Therefore, optical confinement to the active layer 2 becomes larger in the DFB laser portion.

Moreover, since the island-like corrugation by the guiding layer 6 is of an n-type and there is a guiding loss, a so-called gain/loss coupling DFB laser is realized, and the single longitudinal mode capability is intensified. This is because the use of he corrugation periodically varying not only in refractive index but also in gain and loss contributes to stabilization of the longitudinal mode.

On the other hand, in the EAM portion, the corrugation 10 is made shallower, and the influence of the guiding layer 6 operating as the absorption layer becomes dominant to increase optical confinement to the guiding layer 6 larger than the active layer 2. As a result, absorption to the active layer 2 decreases, and the extinction ratio can be increased. FIG. 3 also shows a profile of the guiding mode indicating the optical confinement status. As a result of researches by the Inventor, it has been confirmed that, in order to ensure a practical value of the extinction ratio of an integrated device, optical confinement factor to the active layer 2 in the EAM portion is desirably held in a value not larger than one half the optical confinement factor to the active layer 2 in the laser portion.

Thus, by reducing the fundamental absorption in the EAM portion under no bias, a larger extinction ratio can be obtained.

On the other hand, between the DFB laser portion and the EAM portion, the depth of the corrugation gradually varies. In the transition area with gradual changes in depth, configuration of the mode is moderately converted, and undesirable scattering or reflection due to a discontinuous change can be prevented. That is, conversion loss between the DFB laser and EAM is reduced.

As explained above, according to the embodiments, only by commonly using the layer structure and changing the depth of the corrugation, both the DFB laser and EAM can be optimized in structure. As a result a high-performance integrated device can be provided inexpensively.

The invention has been explained by way of embodiments, referring to specific examples. However, the invention is not limited to these specific examples.

For example, although the second embodiment has been explained as substantially keeping a uniform depth of the corrugation in the DFB laser portion, the structure shown in FIG. 1, for example, may be employed in the DFB laser portion. That is, in the DFB laser portion of the optical integrated device shown in FIG. 3, equivalent phase shifting may be made inside the DFB laser by changing the depth of the corrugation in the axial direction (guiding direction). In this manner, a higher-performance DFB laser preventing holeburning can be integrated.

Additionally, cross-sectional configuration of the corrugation is not limited to the symmetric one as illustrated in the drawings, but the corrugation may be asymmetric one having a so-called "blaze angle".

Moreover, the invention is similarly applicable also to DFB lasers made of any kinds of materials, such as GaAlAs lasers, GaInAlP lasers, GaN, lasers, and so on, in addition to InGaAs/InP lasers, and still ensures the same effects.

Furthermore, the invention is applicable to all kinds of optically functional devices having a corrugation along a guiding structure, not limited to lasers or optical modulators. Examples of such optically functional devices are light emitting elements and grating couplers, among others. Needless to say, the invention is similarly applicable to optically functional devices as integrated devices incorporating those elements.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

The entire disclosure of Japanese Patent Application No.H10-309924 filed on Oct. 30, 1998 including specification, claims, drawings and summary is incorporated herein by reference in its entirety.

What is claimed is:

1. An optically functional device, comprising:
an optical guiding structure for guiding light in a guiding direction, said optical guiding structure having a corrugation, said corrugation including a first portion having a first structure and a second portion having a second structure different from said first structure along said guiding direction,
wherein a difference between said first structure and said second structure is substantially larger than a perturbation of an effective refractive index of said optical guiding structure,
wherein a difference between an effective refractive index of said optical guiding structure corresponding to said first portion and an effective refractive index of said optical guiding structure corresponding to said second portion is not smaller than $10^{-3}$;
wherein said corrugation includes a portion continuously changing in structure between said first portion and said second portion, and wherein said corrugation has a period corresponding to the second or higher order of Bragg diffraction.

2. An optically functional device, comprising:
an optical guiding structure for guiding light in a guiding direction, said optical guiding structure having a corrugation, said corrugation including a first portion having a first structure and a second portion having a second structure different from said first structure along said guiding direction,
wherein a difference between said first structure and said second structure is substantially larger than a perturbation of an effective refractive index of said optical guiding structure, and
wherein a difference between an effective refractive index of said optical guiding structure corresponding to said first portion and an effective refractive index of said optical guiding structure corresponding to said second portion is not smaller than $10^{-3}$, and
wherein said guiding structure has a guiding layer on which said corrugation is formed, said guiding layer being divided in form of islands in said second portion, wherein said corrugation has a period corresponding to the second or higher order of Bragg diffraction.

3. An optically functional device, comprising:
an optical guiding structure for guiding light in a guiding direction, said optical guiding structure having a corrugation, said corrugation including a first portion having a first structure and a second portion having a second structure different from said first structure along said guiding direction,
wherein a difference between said first structure and said second structure is substantially larger than a perturbation of an effective refractive index of said optical guiding structure,
wherein a difference between an effective refractive index of said optical guiding structure corresponding to said first portion and an effective refractive index of said optical guiding structure corresponding to said second portion is not smaller than $10^{-3}$; and
an active layer provided substantially in parallel with said guiding structure,
said optically functional device being configured as a distributed feedback laser or a distributed Bragg reflection laser in which light from said active layer is guided by said guiding structure and released externally, and
wherein said corrugation has a period corresponding to the second or higher order of Bragg diffraction.

4. An optically functional device, comprising:
an optical guiding structure for guiding light in a guiding direction, said optical guiding structure having a corrugation, said corrugation including a first portion having a first structure and a second portion having a second structure different from said first structure along said guiding direction, and
wherein a difference between said first structure and said second structure is substantially larger than a perturbation of an effective refractive index of said optical guiding structure, and
wherein a difference between an effective refractive index of said optical guiding structure corresponding to said first portion and an effective refractive index of said optical guiding structure corresponding to said second portion is not smaller than $10^{-3}$; and
an active layer provided substantially in parallel with said guiding structure,
said second portion of said corrugation form a laser portion operative as a distributed feedback laser or a distributed Bragg reflection laser in which light from said active layer is guided by said guiding structure and released;
said first portion of said corrugation forming a modulator portion which functions as an electroabsorption modulator for modulating laser light from said second portion; and optical confinement factor for confining light to said active layer in said modulator portion being not larger than one half of optical confinement factor for confining light to said active layer in said laser portion.

5. The optically functional device according to claim 4, wherein said corrugation has a period corresponding to the second or higher order of Bragg diffraction.

6. An optically functional device, comprising:

an optical guiding structure for guiding light in a guiding direction, said optical guiding structure having a corrugation, wherein said corrugation has a period corresponding to the second or higher order of Bragg diffraction, said corrugation including a deep-configured portion and a shallow-configured portion along said guiding direction; and wherein a difference between an effective refractive index of said optical guiding structure in said deep-configured portion and an effective refractive index of said optical guiding structure in said shallow-configured portion is not smaller than $10^{-3}$.

7. The optically functional device according to claim 6 wherein said guiding structure has a guiding layer on which said corrugation is formed, said guiding layer being divided in form of islands in said deep-configured portion.

8. The optically functional device according to claim 6, further comprising an active layer provided substantially in parallel with said guiding structure, said optically functional device being configured as a distributed feedback laser or a distributed Bragg reflection laser in which light from said active layer is guided by said guiding structure and released externally.

9. The optically functional device according to claim 6 wherein said corrugation includes a portion continuously changing in depth between said deep-configured portion and said shall-configured portion.

10. An optically functional device, comprising:

an optical guiding structure for guiding light in a guiding direction, said optical guiding structure having a corrugation, said corrugation including a deep-configured portion and a shallow-configured portion along said guiding direction; and wherein a difference between an effective refractive index of said optical guiding structure in said deep-configured portion and an effective refractive index of said optical guiding structure in said shallow-configured portion is not smaller than $10^{-3}$; and an active layer provided substantially in parallel with said guiding structure, said deep-configured portion of said corrugation form a laser portion operative as a distributed feedback laser or a distributed Bragg reflection laser in which light from said active layer is guided by said guiding structured and released;

said shallow-configured portion of said corrugation forming a modulator portion which functions as an electro-absorption modulator for modulating laser light from said deep-configured portion; and an optical confinement factor for confining light to said active layer in said modulator portion being not larger than one half of an optical confinement factor for confining light to said active layer in said laser portion.

11. An optically functional device monolithically integrating a laser portion operative as a distributed feedback laser or a distributed Bragg reflection laser and a modulator portion operative as an electroabsorption modulator, comprising:

a common active layer formed in said laser portion and said modulator portion; and a common guiding layer operative as a waveguide in said laser portion and as an light absorption layer in said modulator portion, said guiding layer having formed a corrugation in said laser portion, optical confinement factor for confining light to said active layer in said modulator portion being not larger than one half of optical confinement factor for confining light to said active layer in said laser portion.

12. The optically functional device according to claim 11 wherein said corrugation has a period corresponding to the second or higher order of Bragg diffraction.

13. The optically functional device according to claim 11 wherein said corrugation continuously changes in structure near the boundary between said laser portion and said modulator portion.

14. The optically functional device according to claim 13 wherein said corrugation continuously changes in depth near the boundary between said laser portion and said modulator portion.

* * * * *